United States Patent
Moriya et al.

(10) Patent No.: US 7,364,028 B2
(45) Date of Patent: Apr. 29, 2008

(54) GLASS SUBSTRATE TRANSPORTING FACILITY

(75) Inventors: Susumu Moriya, Kani (JP); Katsuhiko Ueda, Konan (JP)

(73) Assignee: Daifuku Co., Ltd., Osaka (JP)

( * ) Notice: Subject to any disclaimer, the term of this patent is extended or adjusted under 35 U.S.C. 154(b) by 0 days.

(21) Appl. No.: 10/988,749

(22) Filed: Nov. 15, 2004

(65) Prior Publication Data

US 2005/0135905 A1 Jun. 23, 2005

(30) Foreign Application Priority Data

Dec. 4, 2003 (JP) ............................. 2003-406112

(51) Int. Cl.
*B65H 1/00* (2006.01)
(52) U.S. Cl. ............................. 198/347.1; 198/465.1; 198/468.6; 414/222.01; 414/225.01; 414/226.02; 414/226.05
(58) Field of Classification Search ............. 198/347.1, 198/465.1, 468.6; 414/222.01, 225.01, 226.02, 414/226.05
See application file for complete search history.

(56) References Cited

U.S. PATENT DOCUMENTS

| | | | | |
|---|---|---|---|---|
| 4,373,840 A | * | 2/1983 | Miller, Jr. ................ | 198/346.1 |
| 4,655,676 A | * | 4/1987 | Jannborg et al. ............ | 414/736 |
| 4,986,715 A | * | 1/1991 | Asakawa ................ | 414/331.05 |
| 5,474,641 A | * | 12/1995 | Otsuki et al. ................ | 438/694 |
| 5,525,106 A | * | 6/1996 | Iizuka et al. ................. | 454/187 |
| 5,784,799 A | * | 7/1998 | Kato et al. ..................... | 34/92 |
| 6,460,414 B1 | * | 10/2002 | Erickson et al. .............. | 73/603 |
| 6,547,504 B2 | * | 4/2003 | Shinozuka ............. | 414/222.01 |
| 6,681,916 B2 | * | 1/2004 | Hiroki ...................... | 198/347.1 |
| 6,729,823 B2 | * | 5/2004 | Sakata et al. ................ | 414/217 |
| 6,790,286 B2 | * | 9/2004 | Nishimura et al. .......... | 118/712 |
| 2003/0147643 A1 | * | 8/2003 | Miyata et al. .............. | 396/564 |
| 2004/0105738 A1 | * | 6/2004 | Ahn et al. ............. | 414/222.01 |
| 2006/0018737 A1 | * | 1/2006 | Wang et al. ........... | 414/222.01 |

FOREIGN PATENT DOCUMENTS

| | | | |
|---|---|---|---|
| JP | 63258320 A | * | 10/1988 |
| JP | 63267612 A | * | 11/1988 |
| JP | H06-20310 | | 3/1994 |
| JP | 2002-29605 | | 1/2002 |
| JP | 2002-237512 | | 8/2002 |
| JP | 2002-308422 | | 10/2002 |

* cited by examiner

*Primary Examiner*—Gene O. Crawford
*Assistant Examiner*—Leslie A Nicholson, III
(74) *Attorney, Agent, or Firm*—The Webb Law Firm

(57) ABSTRACT

Glass substrates are transported to a plurality of processing devices to be processed. Certain of the processing devices have associated storage shelf for storing glass substrates and a transfer device. The transfer device is adapted to move the glass substrate between the processing device and the storage shelf and between the storage shelf and the transporting device.

25 Claims, 8 Drawing Sheets

GLASS SUBSTRATE TRANSPORTING FACILITY

BACKGROUND OF THE INVENTION

The present invention relates to glass substrate transporting facilities that are provided with a transporting apparatus for transporting glass substrates such that they pass through a plurality of devices for processing.

Facilities for transporting glass substrates such as that described above include processing devices such as cleaning devices, film-formation devices, exposure devices, and etching devices. By transporting a glass substrate to these processing devices, the glass substrate is subjected to desired processing, and when processing of the glass substrate at that processing device is finished, the glass substrate is carried to the next processing device.

In conventional glass substrate transporting facilities, processing devices were disposed with a spacing between them in the transporting direction of the transporting apparatus, and the transporting apparatus carried the glass substrates in a single row. In the transporting apparatus, a storage shelf for storing the glass substrates was disposed on the transporting route thereof (for example, see JP 2002-308422A).

However, in such conventional transporting facilities for glass substrates, the storage shelf is disposed on the transporting route of the transporting apparatus, and thus when a processing device breaks down it is possible to store the glass substrates in the storage shelf, but when the transporting apparatus breaks down it is not possible to use the transporting apparatus to transport the glass substrate to the storage shelf.

Also, if the transporting apparatus breaks down, there are instances in which it is preferable to remove glass substrates for which processing by the processing device has finished from that processing device. Improvements in this area were desired in this area with conventional transporting facilities.

SUMMARY OF THE INVENTION

The present invention was arrived at in light of the foregoing problems, and it is an object thereof to provide transporting facilities for glass substrates that can transport the glass substrates in a manner in which storage of the glass substrates is possible.

To achieve this object, the glass substrate transporting facility is provided with a plurality of processing devices for processing glass substrates, a transporting apparatus for transporting glass substrates such that glass substrates pass by the plurality of processing devices, storage shelves capable of storing glass substrates between the transporting apparatus and the processing devices, and transfer devices each capable of transferring glass substrates between the transporting apparatus and associated one of the processing devices, between the transporting apparatus and associated one of the storage shelves, and between the associated one of the processing device and the associated one of the storage shelves, wherein at least one each of the transfer device and the storage shelf is provided to each of some of the plurality of processing devices.

Consequently, the transfer devices provided with the storage shelf are capable of transferring the glass substrates between the transporting apparatus and the storage shelf and between the processing device and the storage shelf, and thus it is possible for the transfer devices to store in the storage shelf the glass substrates that are to be supplied to the processing devices and for the transfer devices to store in the storage shelf the glass substrates for which processing by the processing device is finished.

Also, with a processing device provided with a storage shelf and the transfer device, when a processing device is broken, it is possible to store the glass substrate that is to be supplied to that processing device in the storage shelf. And when the transporting apparatus is broken, it is possible to store glass substrates for which processing by the processing device is finished in the storage shelf.

DETAILED DESCRIPTION OF PREFERRED EMBODIMENTS

Embodiments of the transporting facility for glass substrates of the present invention are described below with reference to the drawings.

Figure 1:
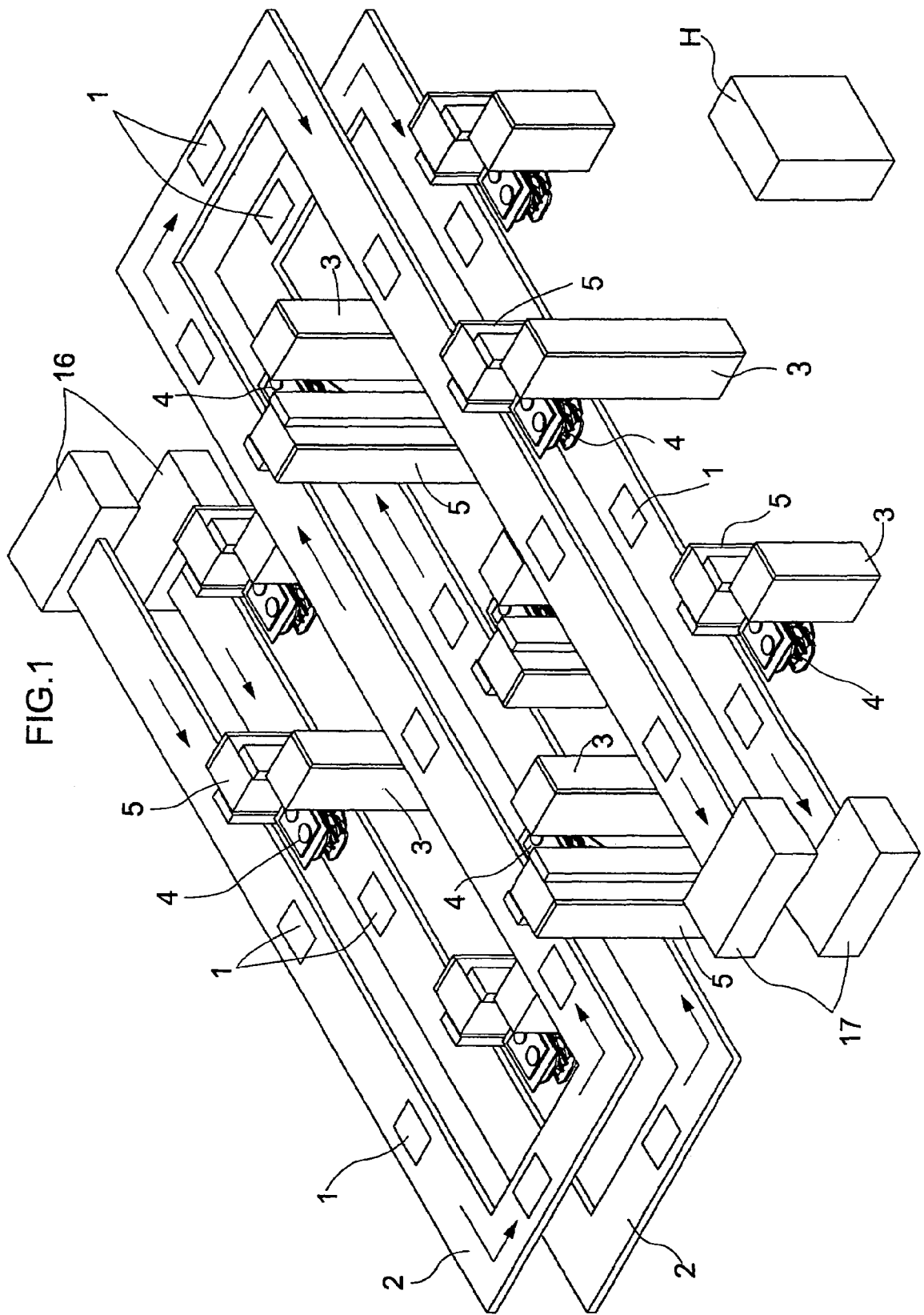
FIG. 1 is a perspective view of the glass substrate transporting facility.
Figure 2:
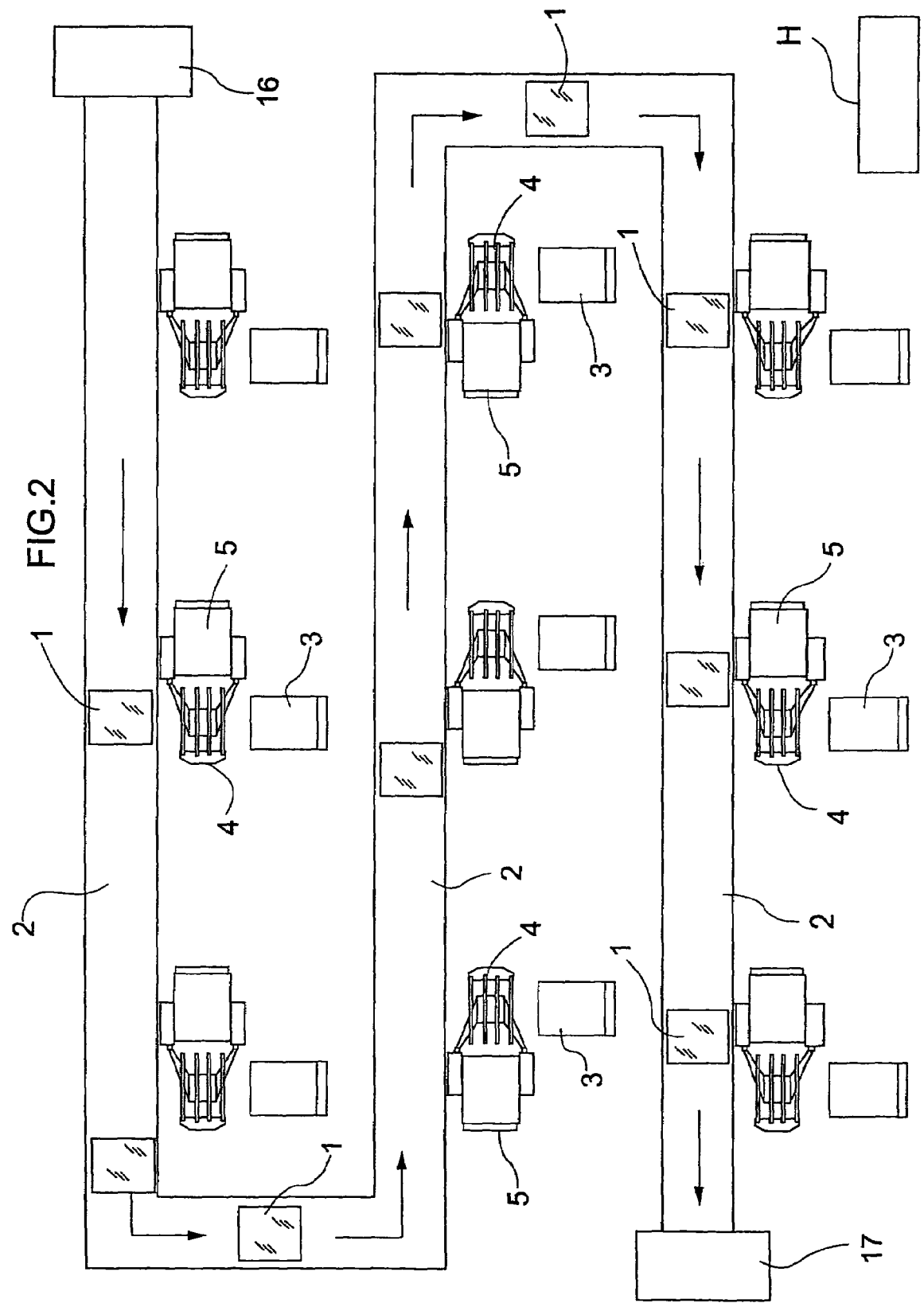
FIG. 2 is a plan view of the glass substrate transporting facility.

The glass substrate transporting facility, as shown in FIG. 1 and FIG. 2, has transporting apparatuses 2 for transporting glass substrates 1, processing devices 3 for processing glass substrates 1, and a control device H for controlling the operation of the transporting apparatuses 2 and the processing devices 3.

The transporting apparatuses 2 are disposed in two levels in the vertical direction. Each transporting apparatus 2 disposed in these two levels carries glass substrates 1 such that the glass substrates 1 pass through a plurality of processing devices 3.

Although not shown, the transporting apparatuses 2 each transport the glass substrates 1 by applying a drive force in the transporting direction to the glass substrates 1 while blowing air toward the glass substrate 1 to contactlessly support the glass substrates 1 in a horizontal orientation.

Introducing devices 16 for transferring glass substrates 1 to the transporting apparatus 2 one at a time are provided on the upstream side end portion in the transporting direction of the transporting apparatuses 2. Discharge devices 17 for storing the glass substrates 1 that are carried by the transporting apparatus 2 in a storage device that is capable of accommodating a plurality of glass substrates 1 are provided on the downstream side end portion in the transporting direction of transporting apparatuses 2.

Furthermore, although not shown in the drawings, the introducing devices 16 remove one glass substrate 1 at a time from a cassette that serves as a storage device accommodating a plurality of glass substrates 1, and transfers these to the transporting apparatus 2. Also, the discharge devices 17 successively store the glass substrates 1, which are carried in a row one at a time by the transporting apparatus 2, in a cassette serving as a storage device.

Examples of the processing devices 3 include cleaning devices, film-formation devices, exposure devices, and etching devices. These processing devices 3 are disposed, with a spacing between them, from the upstream side in the transporting direction of the transporting apparatuses 2 in the order in which the glass substrates 1 are to be processed.

Each of the upper and lower transporting apparatuses 2 is provided with transfer devices 4 for transferring glass substrates 1 between the transporting apparatus 2 and the processing devices 3, and storage shelves 5, which are capable of storing glass substrates 1, between the transporting apparatus 2 and the processing devices 3. A plurality of transfer devices 4 and storage devices 5 are provided, one each corresponding to each one of the plurality of processing devices 3. Further, the transfer devices 4 are capable of transferring glass substrates 1 between the transporting apparatus 2 and the storage shelves 5 and between the processing devices 3 and the storage shelves 5.

As shown in FIG. 2, the transfer devices 4 are positioned between the transporting apparatus 2 and the processing devices 3. Further, the open portion of the article storage shelves 5 faces the transfer devices 4. A single article storage shelf 5 is arranged for each processing device 3 in such a manner that the direction in which the glass substrate 1 is inserted into and removed from the article storage shelf 5 is along the transporting direction of the transporting apparatus 2.

As shown in FIGS. 3 to 6, each transfer device 4 is provided with a loading portion 7 that can rotate about a vertical axis X1 and that can be advanced toward and retreated from a base member 6, which can be moved up and down. The glass substrate 1 rests on the loading portion 7.

Figure 3:
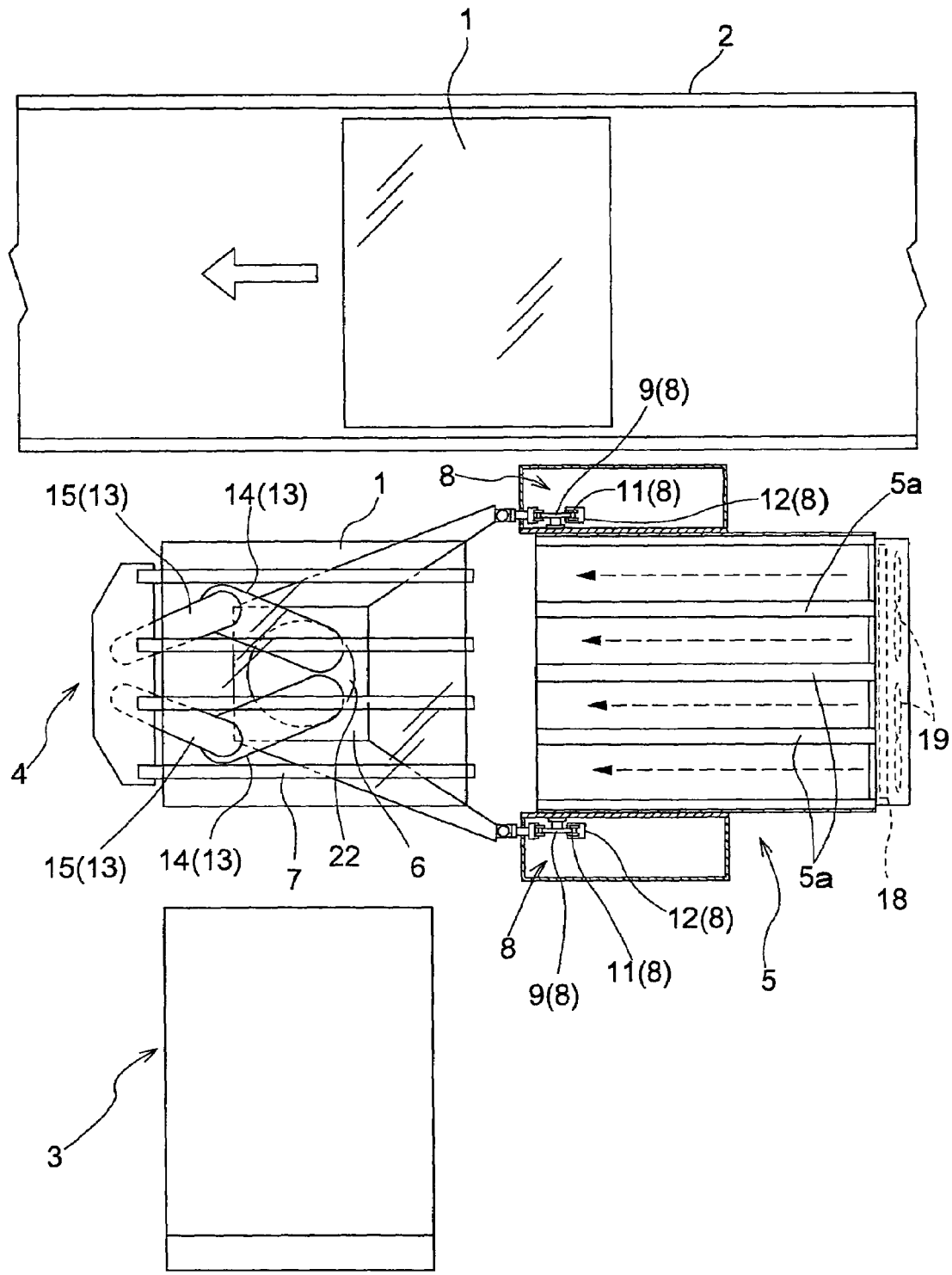
FIG. 3 is a plan view of a transfer device and a storage shelf.
Figure 4:
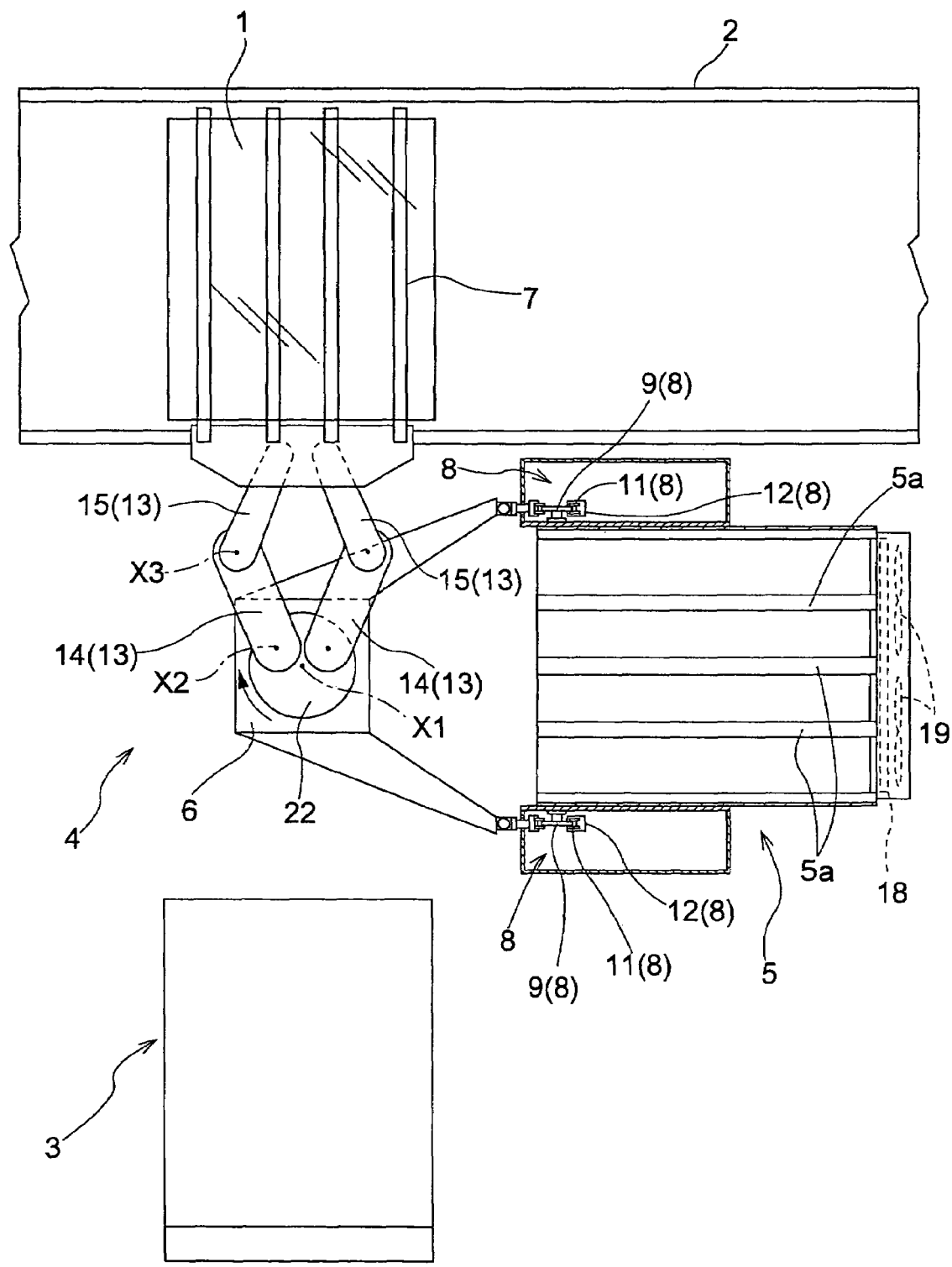
FIG. 4 is a plan view of a transfer device and a storage shelf.
Figure 5:
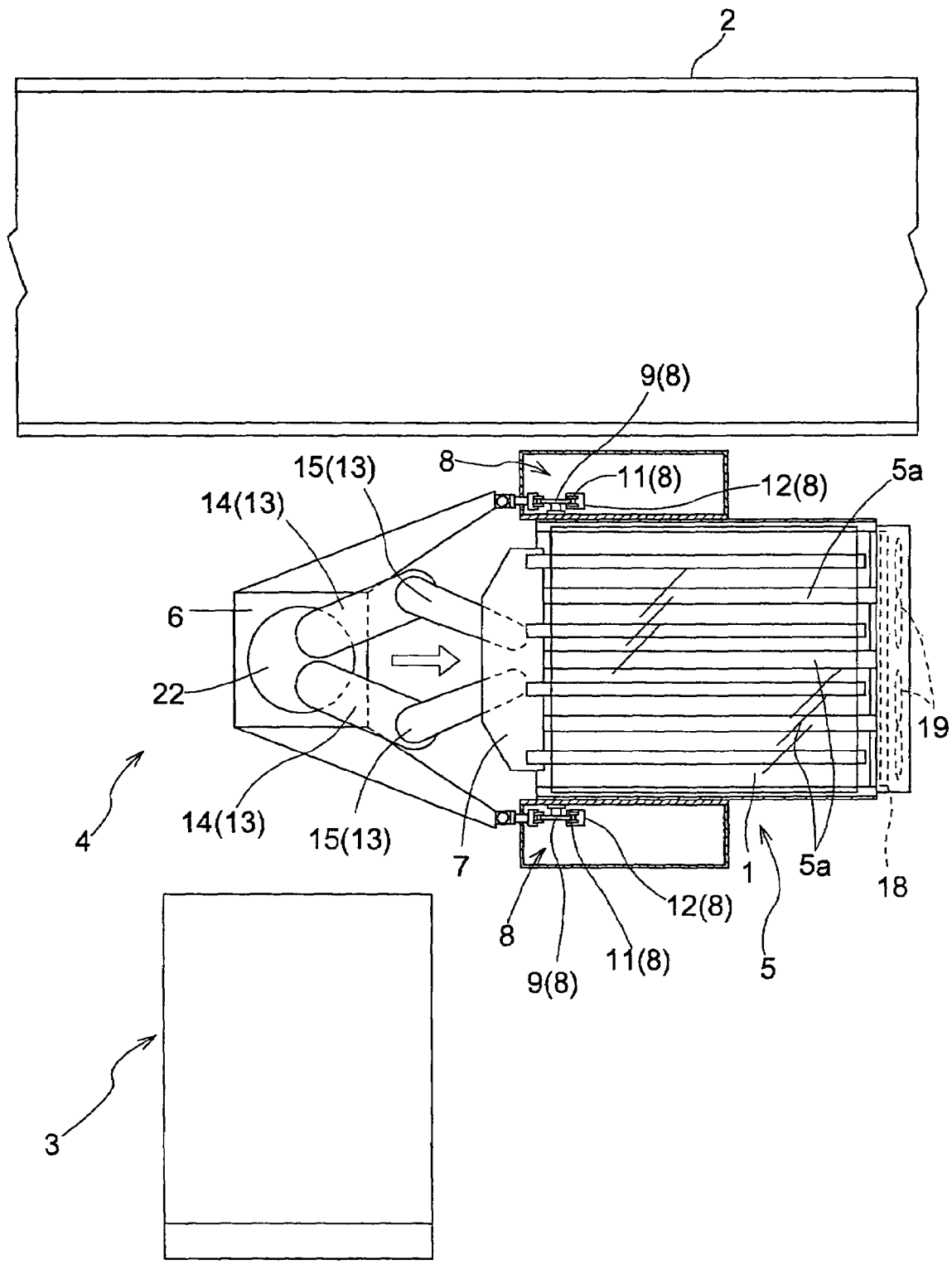
FIG. 5 is a plan view of a transfer device and a storage shelf.

Also, two base members 6 and loading portions 7 are arranged vertical to one another. As shown in FIGS. 3 to 5, the loading portions 7 are made of a plurality of long catch portions (or long fingers) provided with a spacing between them. In the present embodiment, the loading portions 7 are made of four catch portions, and the glass substrate 1 is supported on the upper surface of these catch portions.

FIG. 3 shows the base member 6 and the loading portion 7 in a base position, which is discussed later. FIG. 4 shows a state in which the base member 6 and the loading portion 7 have scooped up the glass substrate 1 on the transporting apparatus 2. FIG. 5 shows a state in which the base member 6 and the loading portion 7 have inserted the glass substrate 1 into the storage shelf 5.

As shown in FIG. 5, vertical drive portions 8 for moving the base member 6 up and down are supported on both side portions of a frame member forming the storage shelf 5, and the base member 6 is supported on the frame member of the storage shelf 5.

Figure 6:
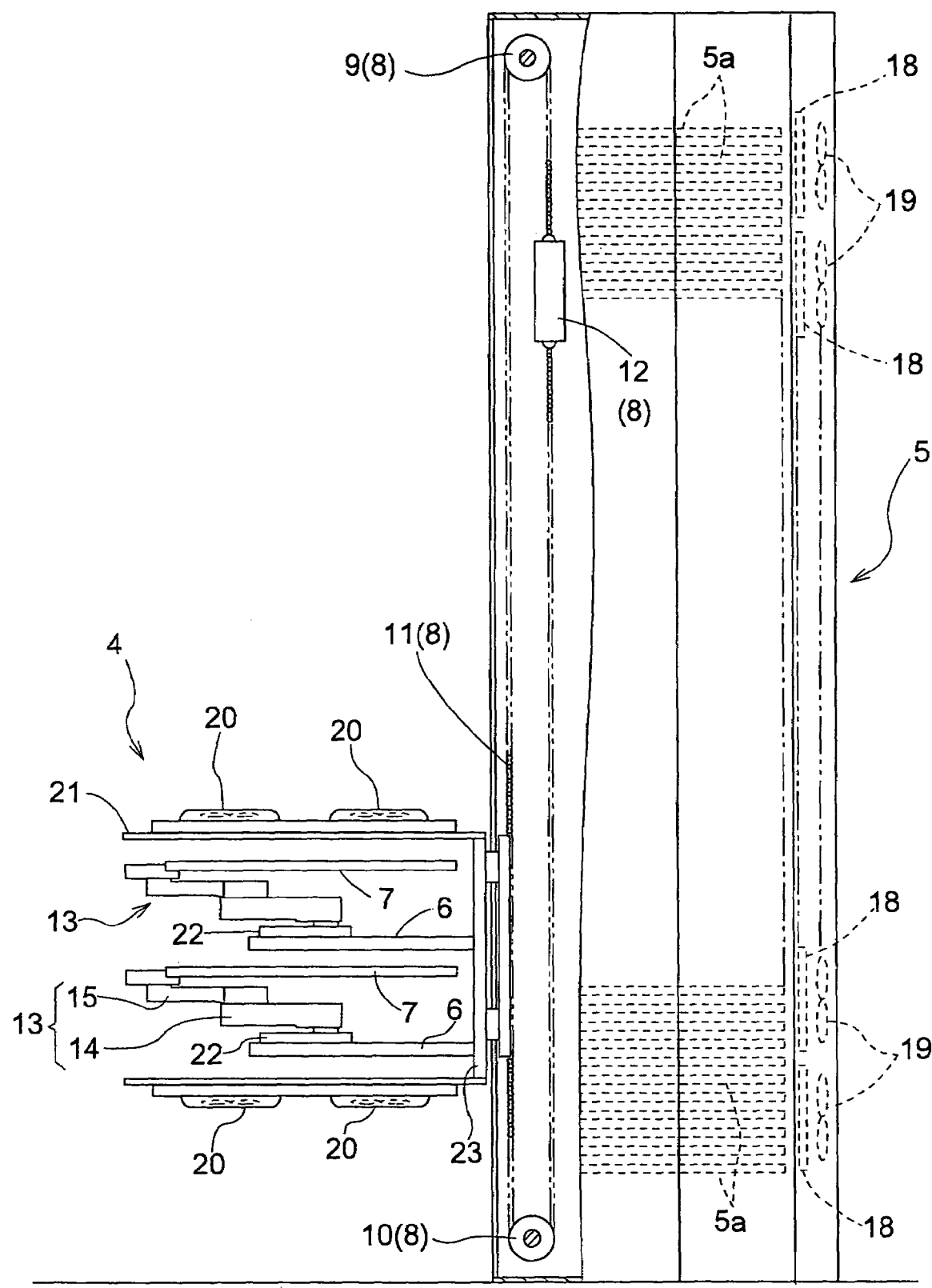
FIG. 6 is a lateral view of a vertical section of a transfer device and a storage shelf.

As shown in FIG. 6, the vertical drive portions 8 have among other things, a pair of upper and lower sprockets 9 and 10, a chain 11 that is wound around these, and a counter weight 12. Of the pair of upper and lower sprockets 9 and 10, the sprocket on one side is a drive sprocket 9 and the sprocket on the other side functions as a free rotation sprocket 10.

The two base members 6 arranged vertical to one another are connected by a connecting member 23 that is connected to and supported by the chain 11. And by driving the drive sprocket 9 with a drive motor or the like, which is not shown, the chain 11 is pulled between the drive sprocket 9 and the free rotation sprocket 10, integrally moving the two base members 6, which are arranged vertical to one another.

Also, by adopting a configuration in which the two base members 6, which are arranged vertical to one another, move up and down as a single unit, the base members 6 are provided with two loading portions 7 that move up and down in synchronization with one another.

The configuration for rotatively moving, and for advancing and retreating, the loading portions 7 is described below, but since the two loading portions 7 have the same configuration, the configuration of only one is described.

The base member 6 is provided with a link mechanism 13 that supports the loading portion 2 on a revolving platform 22, which can freely rotate about a vertical axis (X1) in a manner that allows it to be moved forward and backward, and due to the revolving platform 6 and the link mechanism 13, the loading portion 7 can be rotated and moved forward and backward.

As shown in FIGS. 3 to 5, the link mechanism 13 is made of a pair of action links 14 that are connected to the revolving platform 22 such that their base end portions can rotate about a vertical axis (X2), and swing links 15 each connected to the fore end portion of an action link 14 in such a manner that it can rotate about a vertical axis (X3) and connected to a loading portion 7 in such a manner that it can rotate about a vertical axis.

In this configuration, the pair of action links 14 are driven together by an electric motor that is not shown and swung about the vertical axis (X2), thereby moving the loading portion 7 toward and away from the base member 6. At this time, the action links 14 move between the position shown in FIG. 3 and the position shown in FIG. 5. In other words, each of the action links 14 swings about a vertical axis (X2) by an angle of at least 90 degrees. Thus, the distance between the base member 6 and the article storage shelf 5 can be kept as short as possible and at the same time the loading portion 7 can be moved to a position that is suitably removed from the storage shelf 5. The transfer devices 4 therefore can kept from occupying a large area within the transporting facility.

In this way, the loading portion 7 is configured such that it can be moved toward and away from the base member 6 by actuating the link mechanism 13 with an electric motor that is outside the drawing, and the transfer devices 4 are configured such that the two loading portions 7 lined up vertically are advanced and retreated in synchronization with one another by synchronizing the operation of an electric motor for the loading portion 7 disposed on the upper side and an electric motor for the loading portion 7 disposed on the lower side.

The transfer devices 4 are also configured such that they start movement of the base member 6 and the loading portion 7 from a base position in which the base member 6 is positioned at the lower limit position in the vertical direction and the loading portion 7 has been retreated and the direction in which it is advanced and retreated is facing the storage shelf 5.

More specifically, by starting movement of the base member 6 and the loading portion 7 from the base position shown in FIG. 3, the glass substrate 1 is transferred between the transporting apparatus 2 and the processing device 3, between the transporting apparatus 2 and the storage shelf 5, and between the processing device 3 and the storage shelf 5. When transfer of the glass substrate 1 is finished, the transfer device 4 returns the base member 6 and the loading portion 7 to the base position. As shown in FIG. 3, when the transfer device 4 is regarded as the center, the transporting apparatus 2 is positioned at 0° in the upward direction in FIG. 3, that is at 0°, the storage shelf 5 is positioned at 90°, and the processing device is positioned at 180°.

As shown in FIG. 3, the base position is set so that the base member 6 and the loading portion 7 do not interfere with other members and so that it is easy to confirm that the base member 6 and the loading portion 7 are in the base position.

Incidentally, of the two transporting apparatuses 2 that are arranged vertical to one another, the transfer devices 4 for the transporting apparatus 2 disposed on the upper side can move the base member 6 downward to the transporting apparatus 2 disposed on the lower side, and its lower limit position in the vertical direction is the lower limit position in the vertical direction for the transporting apparatus 2 disposed on the upper side.

A case in which the glass substrate 1 is transferred from the transporting apparatus 2 to a storage shelf 5 serves as an example in the following description. First, a transfer device 4 moves the base member 6 upward from the base position shown in FIG. 3, rotatively moves the loading portion 7, and then advances the loading portion 7 forward, thereby scooping up the glass substrate 1 on the transporting apparatus 2 as shown in FIG. 4.

When the transfer device 4 has scooped up the glass substrate 1 from the transporting apparatus 2, it moves the loading portion 7 away from the transporting apparatus 2 and then rotates the loading portion 7, and with the direction in which the loading portion 7 is advanced and retreated facing the storage shelf 5, the transfer device 4 advances the loading portion 7 forward as shown in FIG. 5 to transfer the glass substrate 1 to the storage shelf 5. When finished transferring the glass substrate 1 to the storage shelf 5, the transfer device 4 returns to the base position shown in FIG. 3.

Figure 7:
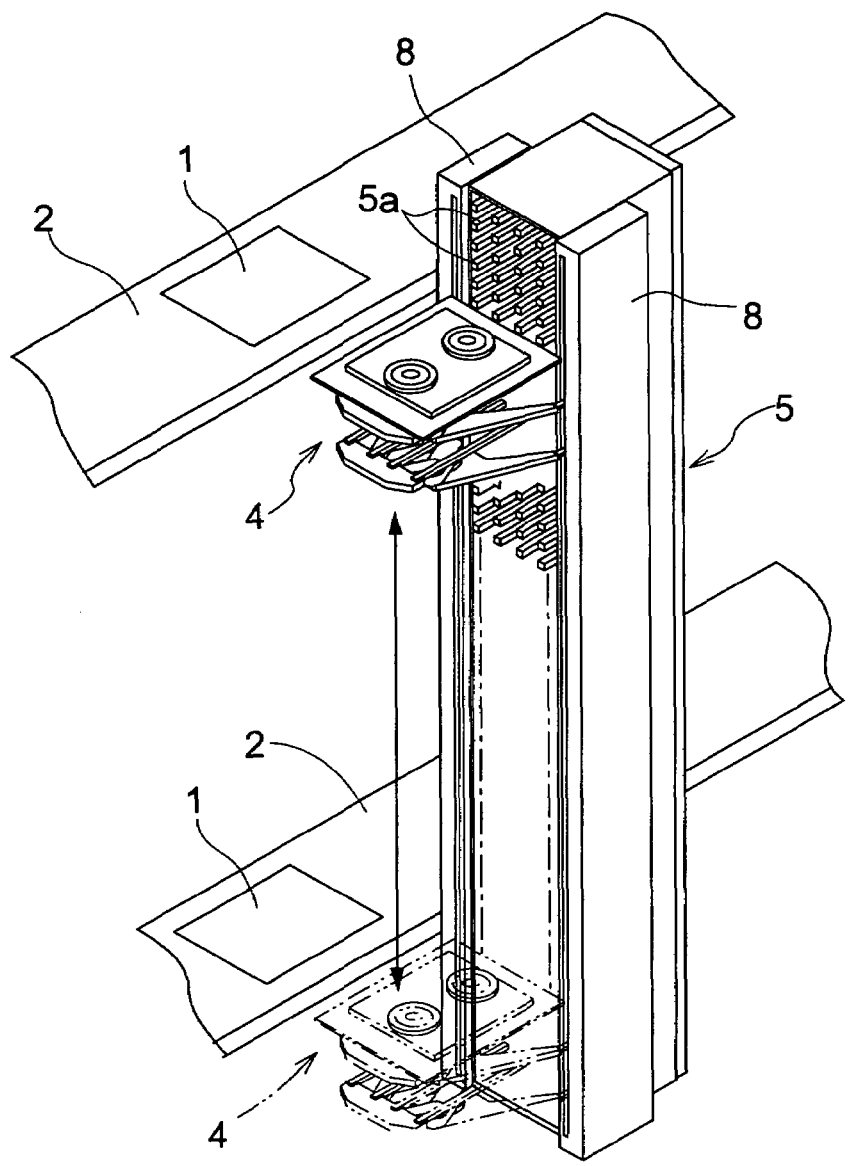
FIG. 7 is a perspective view showing a transfer device and the transporting apparatus.

As shown in FIG. 7, the transfer device 4 is capable of transferring the glass substrate 1 between the two transporting apparatuses 2, which are arranged vertical to one another. That is, of the two upper and lower transporting apparatuses 2, the transfer device 4 provided for the upper-side transporting apparatus 2 is capable of lowering the base member 6 downward to the lower-side transporting apparatus 2 due to the vertical drive portions 8, and thus is capable transferring the glass substrate 1 to the lower-side transporting apparatus 2. Similarly, the transfer device 4 provided for the lower-side transporting apparatus 2 is capable of raising the base member 6 upward to the upper-side transporting apparatus 2 due to the vertical drive portions 8, and thus is capable transferring the glass substrate 1 to the upper-side transporting apparatus 2.

As shown in FIG. 1, in order to achieve a configuration in which the vertical drive portions 8 can move the base member 6 up and down between the two transporting apparatuses 2 arranged vertical to one another, the transfer device 4, the processing device 3, and the storage shelf 5 are disposed at different positions in the upper and lower transporting apparatuses 2 in the transporting direction of the transporting apparatus 2.

To describe the storage shelf 5 in greater detail, the storage shelf 5, as shown in FIGS. 3 to 6, is formed in a box-shape whose front surface portion is open, and has a plurality of reception/support portions 5a, which are for receiving and supporting the glass substrate 1, with a spacing between them in the vertical direction, such that it can store a plurality of glass substrates 1.

Also, the processing devices 3 are capable of processing a plurality of glass substrates 1, and the storage shelves 5 are capable of storing at least as many glass substrates 1 as can be processed by the processing devices 3, such as 100 glass substrates 1, for example.

As shown in FIG. 3 and FIG. 5, the reception/support portions 5a are formed as long rods that receive and support both end portions in the width direction and the center portion in the width direction of the glass substrate 1, with a spacing between them. The reception/support portions 5a are disposed so that the spots where the reception/support portions 5a of the storage shelf 5 and the loading portion 7 of the transfer device 4 are located are different, such that the loading portion 7 of the transfer device 4 can freely enter and exit the storage shelf 5 when the transfer device 4 transfers the glass substrate 1 to the storage shelf 5.

As shown in FIG. 6, each storage shelf 5 is provided with purified air blowing fans 19 (purified air blowing means) for blowing purified air through dust-removal filters 18 toward glass substrates 1 that are being stored.

The purified air blowing fans 19 and the dust-removal filters 18 are arranged such that they are in the direction in which air is blown toward the glass substrates 1 resting and supported on the loading portion 7 of the transfer device 4 after air has been blown toward the glass substrates 1 held in the storage shelf 5. That is, the purified air blowing fans 19 and the dust-removal filters 18 are arranged on the rear end portion opposite the open portion of the holding shelf 5, and draw in air from below or behind the storage shelf 5 and sends it through the dust-removal filters 18 to supply purified air forward.

By disposing the purified air blowing fans 19 and the dust-removal filters 18 in the rear end portion of the storage shelf 5, purified air is blown from above onto glass substrates 1 resting on and supported by the loading portion 7 of the transfer device 4.

In this manner, first, purified air from the purified air blowing fans 19 is blown onto the glass substrates 1 held in the storage shelf 5, and then the purified air blowing fans 19 blow the purified air downward from above downward onto the glass substrate 1 supported on the loading portion 7 of the transfer device 4 and then suck in the purified air, thereby circulating the purified air.

The transfer device 4 is also provided with blowing fans 20 that function as blowing means for blowing the purified air from the purified air blowing fans 19 toward the glass substrate 1 resting on and supported by the loading portion 7, and a plate-shaped air blocking member 21 for keeping air from directly hitting the glass substrate 1 that is being supported when the base member 6 is moved upward. The air blocking member 21 is provided with apertures for the blowing fans 20 so that the air from the blowing fans 20 can be delivered to the glass substrate 1.

To explain this in further detail, by providing the transfer device 4 with blowing fans 20 it is possible to deliver purified air that cannot be blown onto the glass substrate 1 resting on and supported by the loading portion 7 by the purified air blowing fans 19 alone, accurately blowing purified air onto the glass substrate 1 resting on and supported by the loading portion 7.

As shown in FIG. 6, the blowing fans 20 are positioned above the air blocking member 21, and the air blocking member 21 is disposed so as to cover the upper loading portion 7, of the loading portions 7, which are arranged vertical to one another. The blowing fans 20 are also provided below the loading portions 7, which are arranged vertical to one another.

The blowing fans 20 and the air blocking member 21 are both supported on the base member 6, and move up and down in a single unit with the base member 6. The vertical drive portions 8 of the transfer device 4 are disposed on both side portions outside the frame member of the storage shelf 5, and both are disposed at positions that are removed from the direction in which the purified air is blown by the purified air blowing fans 19. In the configuration adopted here, the purified air from the purified air blowing fans 19 is blown onto the glass substrates 1 held in the storage shelf 5 without interference from the vertical drive portions 8, and then is blown from above downward onto the glass substrate 1 that is resting on and supported by the loading portion 7 of the transfer device 4.

Figure 8:
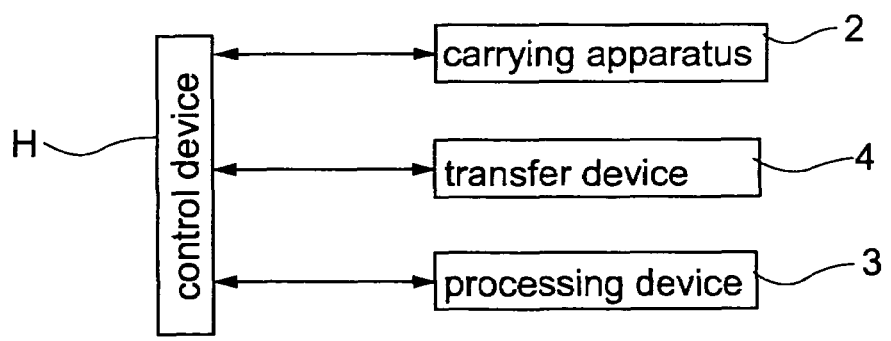
FIG. 8 is a control block diagram of the glass substrate transporting facility.

The control device H, as shown in FIG. 8, controls the operation of the transporting apparatuses 2 and the processing devices 3, and also controls the operating state of the transfer devices 4.

The control device H manages information on which processing device 3 to supply the glass substrate 1, as well as information such as the storage state of the glass substrates 1 in the storage shelves 5. Further, when the transporting apparatuses 2 and the processing devices 3 are operating normally, the control device H has the transporting apparatus 2 transport the glass substrate 1 up to a position corresponding to a processing device 3 where processing is to take place, and controls the transfer device 4 so that the transfer device 4 transfers the glass substrate 1 from the transporting apparatus 2 to the processing device 3. When processing by the processing device 3 is finished, the control device H then controls the transfer device 4 so that the transfer device 4 returns that glass substrate 1 to the transporting apparatus 2.

Moreover, when a processing device 3 is broken, the control device H controls the transfer device 4 so that it transfers the glass substrate 1 that is to be supplied to that processing device 3 to the storage shelf 5 associated with the broken processing device 3. In other words, the control device H has the transporting apparatus 2 transport the glass substrate 1 to the position corresponding to the processing device 3 where processing is to take place, and controls the transfer device 4 so that the transfer device 4 transfers the glass substrate 1 from the transporting apparatus 2 to the storage shelf 5. When the transporting apparatus 2 is broken, then the control device H controls the transfer devices 4 so that glass substrates 1 for which processing by a processing device 3 is finished are transferred to the storage shelf 5 corresponding to that processing device 3.

When the processing device 3 is no longer broken, then the control device H controls the transfer device 4 so that the glass substrate 1 that is accommodated in the storage shelf 5 is transferred to the processing device 3. When the transporting apparatus 2 is no longer broken, then the control device H controls the transfer device 4 so that the glass substrates 1 stored in the storage shelf 5 are transferred to the transporting apparatus 2.

The control device H is configured so that it stores the glass substrate 1 in the storage shelf 5 when both the processing device 3 and the transporting apparatus 2 are broken, and it also stores the glass substrate 1 in the storage shelf 5 with the transfer device 4 in cases where it is necessary to temporarily hold the glass substrate 1 between the transporting apparatus 2 and the processing device 3, such as when a larger number of glass substrates 1 than can be processed by the processing device 3 has been supplied or when there are numerous glass substrates 1 to return to the transporting apparatus 2.

Also, when transferring a glass substrate 1 that is being carried by the upper-side transporting apparatus 2 to the lower-side transporting apparatus 2, or conversely, when transferring a glass substrate 1 that is being carried by the lower-side transporting apparatus 2 to the upper-side transporting apparatus 2, the control device H lets the transporting apparatus 2 transport the glass substrate 1 up to the spot where the transfer device 4 is located, and then controls the transfer device 4 so that the transfer device 4 transfers the glass substrate 1 between the transporting apparatuses 2, which are arranged in the vertical direction.

OTHER EMBODIMENTS (1) In the foregoing embodiment, the example was of two transporting apparatuses 2 arranged vertical to one another, but the number of transporting apparatuses 2 that are arranged vertical to one another can be suitably altered, and for example there can be one or three or more.

(2) In the foregoing embodiment, transfer devices 4 are provided corresponding to each of the two transporting apparatuses 2 that are arranged vertical to one another, but because the transfer devices 2 are capable of transferring glass substrates 1 between transporting apparatuses 2 that are arranged vertical to one another, it is also possible to adopt a configuration in which a single transfer device 4 is used as the transfer device for two transporting apparatuses 2 that are arranged vertical to one another.

(3) In the foregoing embodiment, the transfer device 4 that served as an example was provided with a base member 6 that can move up and down and a loading portion 7 that can rotate around a vertical axis and can be advanced toward and retreated away from the base member 6 in a state where it is holding and supporting a glass substrate 1 thereon, but various other types of transfer devices can be adopted.

Further, in the foregoing embodiment, the base member 6 of the transfer device 4 is supported on the frame member of the storage shelf 5, but an implementation in which a member for supporting the base member 6 is provided separate from the storage shelf 5 is also possible.

(4) In the foregoing embodiment, all of the transfer devices 4 are capable of transferring glass substrates 1 between the two transporting apparatuses 2 that are arranged vertical to one another, but it is also possible to adopt a configuration in which only some of the transfer devices 4 are capable of transferring glass substrates 1 between the two transporting apparatuses 4 that are arranged vertical to one another, so as to transfer glass substrates 1 between the two transporting apparatuses 4 that are arranged vertical to one another.

It is also possible to adopt a configuration in which not all of the transfer devices 4 are capable of transferring the glass substrates 1 between the two transporting apparatuses 4 that are arranged above and below one another.

(5) In the foregoing embodiment, the vertical drive portions 8 of the transfer device 4 are disposed at positions that are removed from the direction in which the purified air is blown by the purified air blowing fans 19, but the positions where the vertical drive portions 8 of the transfer device 4 are disposed can be suitably changed.

(6) In the foregoing embodiment, the transfer devices 4 are provided with blowing fans 20 and air blocking members 21, but it is not absolutely necessary that the transfer devices 4 are provided with blowing fans 20 and air blocking members 21, and for example, it is also possible for them to be provided with only the blowing fans 20 or with only the air blocking members 21.

(7) In the foregoing embodiment, the transfer devices 4 are provided with two loading portions 7 arranged above and below one another, but it is possible to suitably alter the number of loading portions 8 that are thus arranged vertical to one another, and this number may also be one or three or more.

When there are a plurality of loading portions 7 it is not absolutely necessary that they move forward and backward and up and down at the same time, and it is also possible for the plurality of loading portions 7 to move forward and backward and up and down separately.

(8) In the foregoing embodiment, the glass substrates 1 are carried in a horizontal orientation by the transporting apparatuses 2, but the orientation of the glass substrates 1 when they are carried by the transporting apparatuses 2 can be suitably changed, and for example it is also possible for them to be carried in a vertical orientation.

(9) In the foregoing embodiment, the introducing devices 16 and the discharge devices 17 are provided so as to deliver the glass substrates 1 to and from the transporting apparatuses 2 in cassette units, in which a cassette serves as a storage device that is capable of accommodating a plurality of glass substrates 1, but it is also possible to not provide the introducing devices 16 or the discharge devices 17, and instead deliver one glass substrate 1 at a time to the transporting apparatuses 2 or deliver one glass substrate 1 at a time from the transporting apparatuses 2.

(10) In the foregoing embodiment, the blowing fans 20 are provided above and below the respective loading portions 7, which are arranged vertical to one another, but it is also possible to provide the blowing fans 20 only above the loading portions 7, which are arranged vertical to one another.

Figure 9:
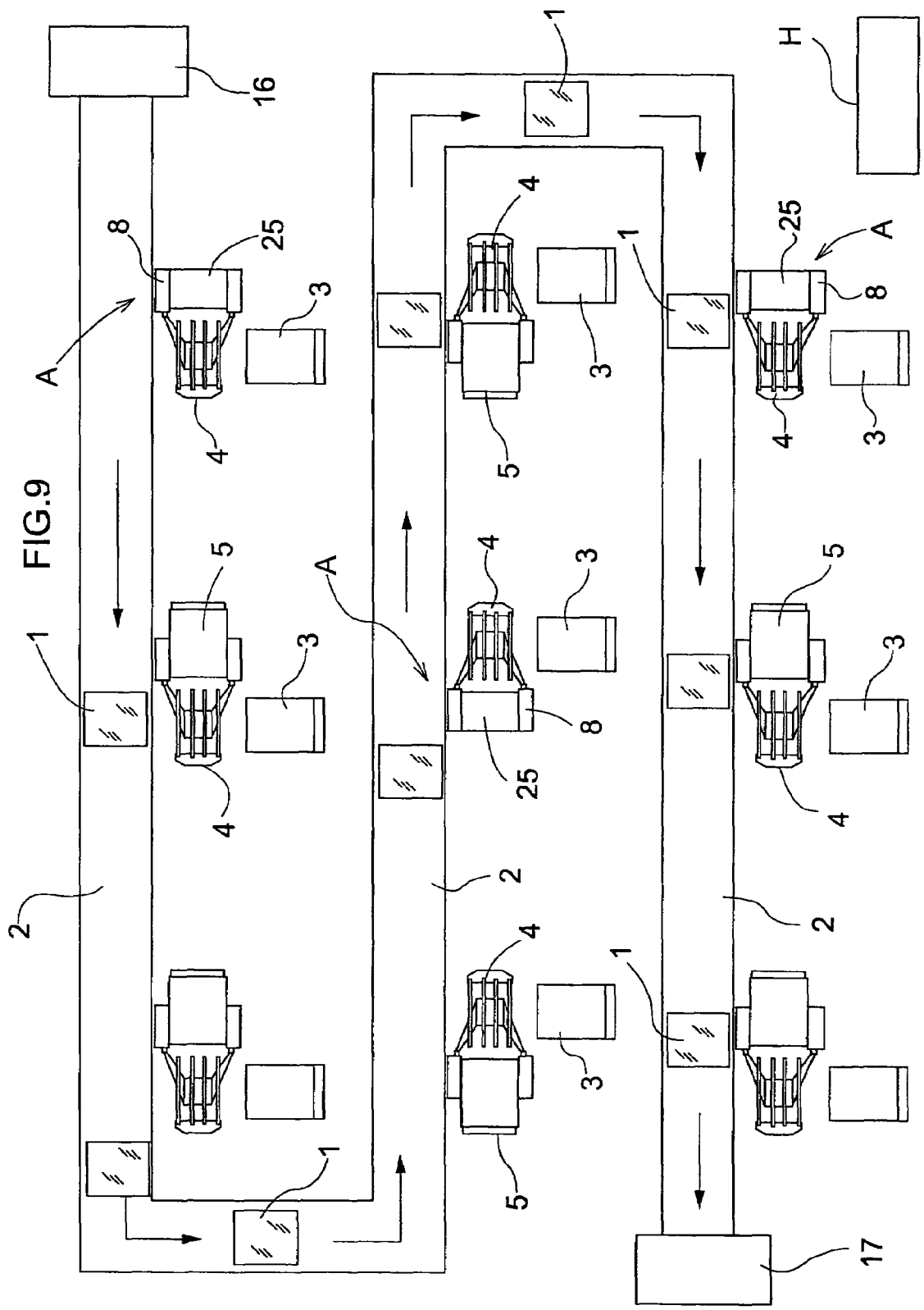
FIG. 9 is a perspective view of the glass substrate transporting facility according to a different embodiment of the invention.

(11) It is not absolutely necessary to provide a storage shelf 5 for processing devices 3 that are not essential. The transfer devices 4 in the regions marked A in FIG. 9 are driven by the vertical drive portions 8, but the processing devices 3 are not provided with a storage shelf 5. The vertical drive portions 8 are supported by a frame 25.

What is claimed is:

1. A glass substrate transporting facility, comprising:
   a plurality of processing devices for processing glass substrates;
   a transporting apparatus for directly transporting glass substrates such that glass substrates pass by the plurality of processing devices;
   storage shelves adapted to store glass substrates, each of the storage shelves being provided separately from the transporting apparatus and having a plurality of groups of glass substrate support portions, the groups being vertically spaced apart for storing a plurality of glass substrates; and
   transfer devices each adapted to directly support and transfer glass substrates between the transporting apparatus and associated one of the processing devices, between the transporting apparatus and associated one of the storage shelves, and between the associated one of the processing device and the associated one of the storage shelves, each of the transfer devices having a loading portion with a member having an upper surface for directly contacting a glass substrate to support the glass substrate, the member of the loading portion comprising at least:
   a) a first finger that has an upper surface arranged to directly contact a glass substrate to support the glass substrate, and that has a sufficient length to support the glass substrate,
   b) a second finger that is horizontally spaced apart from the first finger, that has an upper surface arranged to directly contact the glass substrate to support the glass substrate, and that has a sufficient length to support the glass substrate,
   c) a third finger that is horizontally spaced apart from and located between the first and second fingers, that has an upper surface arranged to directly contact the glass substrate to support the glass substrate, and that has a sufficient length to support the glass substrate; and
   each of said groups of glass substrate support portions comprising at least:
   a) a first support portion configured to support a region adjacent one of two lateral edges of the glass substrate,
   b) a second support portion configured to support a region adjacent the other of the two lateral edges of the glass substrate,
   c) a third support portion positioned between the first and the second support member;
   wherein the first, second, and third fingers are arranged at positions and are moved so as not to interfere with the first, second, and third support portions,
   wherein each of said groups of glass substrate support portions is positioned vertically such that the loading portion of the corresponding one of the transfer devices is capable of removing a glass substrate from and of storing a glass substrate on any one of said groups of glass substrate support portions of the corresponding one of the storage shelves; and
   wherein at least one each of the transfer device and the storage shelf is provided to each of some of the plurality of processing devices.

2. The transporting facility according to claim 1,
   wherein each of the transfer devices is provided with a vertically movable base member; and
   the loading portion is configured to rotate about a vertical axis and to move toward and away from the base member.

3. The transporting facility according to claim 2,
   wherein each of the transfer devices starts movement of the base member and the loading portion from a base position in which the direction in which the loading portion is advanced and retreated is facing the storage shelf, with the base member positioned at the lower limit position in the vertical direction and the loading portion in a retreated state.

4. The transporting facility according to claim 2,
   wherein each of the storage shelves is provided with purified air blowing means for blowing purified air through a dust-removal filter toward the glass substrate that is being stored; and
   wherein the purified air blowing means is disposed such that the direction in which the purified air is blown is the blowing direction in which air is blown onto the glass substrate that is resting on and supported by the loading portion of the transfer device after the air has been blown onto the glass substrate being stored in the storage shelf.

5. The transporting facility according to claim 4,
   wherein a vertical drive portion for driving the base member of the transfer device vertically is arranged at a position that is outside of the region to which purified air is blown by the purified air blowing means.

6. The transporting facility according to claim 4,
wherein the purified air blowing means is disposed such that purified air is blown from above onto the glass substrate resting on and supported by the loading portion; and
wherein the transfer devices are provided with an air blocking member that, when the base member is raised upward, keeps the purified air from the purified air blowing means from being blown onto the glass substrate that is resting on and supported by the loading portion.

7. The transporting facility according to claim 2,
wherein the transfer devices are provided with blowing means for blowing air onto the glass substrate resting on and supported by the loading portion.

8. The transporting facility according to claim 2,
wherein within the transfer devices, a plurality of the loading portions are disposed vertical to one another, and the transfer devices advance and retreat these plurality of loading portions simultaneously.

9. The transporting facility according to claim 8,
wherein the base member supports the plurality of loading portions.

10. The transporting facility according to claim 2,
wherein the base member is supported on a frame member of the storage shelf.

11. The transporting facility according to claim 1,
wherein the processing devices are capable of processing a plurality of glass substrates; and
wherein the number of glass substrates that can be stored in the storage shelf is at least the number that can be processed by the processing devices.

12. The transporting facility according to claim 1,
wherein a plurality of the transporting apparatuses are disposed arranged in a plurality of levels in the vertical direction; and
wherein the transfer devices can transfer the glass substrates between the transporting apparatuses that are disposed on different levels.

13. The transporting facility according to claim 1,
wherein an introducing device for transferring glass substrates to the transporting apparatus one at a time is provided on the upstream end portion in the transporting direction of the transporting apparatus, and
wherein a discharge device for storing the glass substrates that are carried by the transporting apparatus in a storage device that is capable of storing a plurality of the glass substrates is provided on the downstream end portion in the transporting direction of the transporting apparatus.

14. The transporting facility according to claim 1, wherein the plurality of processing devices belong to a plurality of processing sites, such that each processing site includes:
at least one of the processing devices;
at least one of the storage shelves; and
at least one of the transfer devices,
wherein the transporting apparatus transports glass substrates to the plurality of processing sites for sequentially processing the glass substrates; and
wherein the plurality of processing sites are located at such locations that a glass substrate processed at one of the plurality of processing sites must be transported by the transporting apparatus to another one of the plurality of processing sites for further processing.

15. The transporting facility according to claim 1, wherein the processing devices include at least a cleaning device and a film-formation device.

16. The transporting facility according to claim 15, wherein the processing devices further include at least an exposure device and an etching device.

17. The transporting facility according to claim 1, wherein the member having an upper surface is an elongate member having a dimension greater than a greatest dimension of the glass substrate.

18. The transporting facility according to claim 1, wherein the member having an upper surface is an elongate member;
each of the storage shelves has an opening; and
each of the transfer devices is movable between an inserted position where the elongate member is inserted into the associated one of the storage shelves through the opening thereof and a retracted position where the elongate member is out of the opening, when the transfer device is operated to transfer glass substrates to and from the associated one of the storage shelves.

19. A glass substrate transporting facility, comprising:
a plurality of processing devices for processing glass substrates, the processing devices including at least one cleaning device and at least one film-formation device;
a transporting apparatus for directly transporting glass substrates between at least two of the plurality of processing devices;
storage shelves disposed separately from the transporting apparatus in a region of the transporting apparatus and adapted to store glass substrates, each of the storage shelves having a plurality of groups of glass substrate support portions, the groups being vertically spaced apart for storing a plurality of glass substrates; and
transfer devices adapted to transfer glass substrates between the transporting apparatus and associated one of the storage shelves and between associated one of the processing devices and associated one of the storage shelves, each of the transfer devices having a loading portion with a member adapted to substantially contact only a lower surface of a glass substrate, the member of the loading portion comprising at least:
a) a first finger that has an upper surface arranged to directly contact a glass substrate to support the glass substrate, and that has a sufficient length to support the glass substrate,
b) a second finger that is horizontally spaced apart from the first finger, that has an upper surface arranged to directly contact the glass substrate to support the glass substrate, and that has a sufficient length to support the glass substrate,
c) a third finger that is horizontally spaced apart from and located between the first and second fingers, that has an upper surface arranged to directly contact the glass substrate to support the glass substrate, and that has a sufficient length to support the glass substrate; and
each of said groups of glass substrate support portions comprising at least:
a) a first support portion configured to support a region adjacent one of two lateral edges of the glass substrate,
b) a second support portion configured to support a region adjacent the other of the two lateral edges of the glass substrate,
c) a third support portion positioned between the first and the second support members;
wherein the first, second, and third fingers are arranged at positions and are moved so as not to interfere with the first, second, and third support portions,
wherein each of said groups of glass substrate support portions is positioned vertically such that the loading portion of the corresponding one of the transfer devices is capable of removing a glass substrate from and of storing a glass substrate on any one of said groups of glass substrate support portions of the corresponding one of the storage shelves; and wherein at least one each of the transfer device and the storage shelf is provided for each of some of the plurality of processing devices.

20. The transporting facility according to claim 19, wherein each of transfer devices is disposed between associated one of the processing devices and the transporting apparatus.

21. The transporting facility according to claim 19, wherein each of the transfer devices has a revolving platform that can swing about a first vertical axis;

a first arm that is supported on the revolving platform and that can swing about a second vertical axis; and a second arm that is supported on the first arm and that can swing about a third vertical axis;

wherein the first arm can swing at an angle greater than 90°.

22. The transporting facility according to claim 21, wherein the second arm supports a plurality of long fingers.

23. The transporting facility according to claim 19, wherein the transfer devices are disposed next to the storage shelves, and are moved in the vertical direction by a drive member that is provided with a motor.

24. The transporting facility according to claim 19, wherein the storage shelves are provided with blowing fans and filters.

25. The transporting facility according to claim 19, wherein at least one of the transfer devices and at least one of the storage shelves are dedicated to each of the plurality of processing devices wherein the at least one transfer device and the at least one storage shelf dedicated to one of the plurality of processing devices are so located that the at least one transfer device and the at least one storage shelf are unable to handle glass substrates for any other one of the plurality of processing devices.

* * * * *